United States Patent [19]

Mead et al.

[11] Patent Number: 4,605,931

[45] Date of Patent: Aug. 12, 1986

[54] CROSSOVER TRAVELING WAVE FEED FOR MICROSTRIP ANTENNA ARRAY

[75] Inventors: James B. Mead, Brookside; Leonard Schwartz, Montville, both of N.J.; Emile J. Deveau, Pleasantville, N.Y.

[73] Assignee: The Singer Company, Little Falls, N.J.

[21] Appl. No.: 650,631

[22] Filed: Sep. 14, 1984

[51] Int. Cl.$^4$ .......................... H01Q 3/26; H01Q 9/38; H03B 5/00

[52] U.S. Cl. ............................ 343/700 MS; 343/375; 333/117; 333/161; 333/246

[58] Field of Search ............... 333/116, 117, 161, 164, 333/246; 343/700 MS File, 737, 375, 368

[56] References Cited

U.S. PATENT DOCUMENTS 4,347,516 8/1982 Shrekenhamer ............. 343/700 MS

*Primary Examiner*—Eli Lieberman

*Attorney, Agent, or Firm*—Thomas W. Kennedy

[57] ABSTRACT

A feed system for a microstrip or stripline antenna includes a serpentine traveling feed located in the plane of interleaved arrays along which a first signal propagates. A chain of crossover structures serves as a second traveling feed, extends in coplanar parallel spaced relation to the first feed, and carries a second propagated signal therealong. First and second ports of each structure connect the serpentine feed to a first group of arrays for coupling the first signal therebetween while third and fourth ports of each structure couple the second signal to a second set of arrays without significant interaction therebetween.

10 Claims, 10 Drawing Figures

CROSSOVER TRAVELING WAVE FEED FOR MICROSTRIP ANTENNA ARRAY

BRIEF DESCRIPTION OF THE PRIOR ART

The most relevant known prior art antenna utilizes two separate microstrip antennas which are interleaved with each other to occupy substantially the same space as a single antenna. Each of the interleaved antennas includes its own feed and, in this configuration, each antenna aperture produces two beams for a total of four beams operating as a spaced duplexed antenna using the same area for transmit and receive.

Each radiating array connected to a rear feed requires a pin connection between a copper pad on the front of the antenna and a pad on the rear feed. Although this "feed thru" connection enables the interleaved arrays to operate generally satisfactorily, the construction poses a complication which results in signal loss. In addition, feed thru connections of this type result in mismatch along a rear feed. As an additional disadvantage the cost of the antenna is significantly increased due to the need for a separate rear feed and the fabrication and labor associated with the feed thru connections.

BRIEF DESCRIPTION OF THE PRESENT INVENTION

The present invention is directed to a "crossover feed" which eliminates the need for a back feed and the disadvantages thereof. The crossover feed allows two feeding systems on one end of an antenna to cross over one another without significant interaction. A "crossover network" is a microstrip structure that allows two microstrip lines to cross over with a substantial amount (e.g., 40 dB) of isolation between lines. Using one of these networks at each connection point between feed and radiating arrays preserves the independent operation of two traveling wave feed arrays and permits the entire interleaved antenna to be in one plane eliminating the back feed and feed thrus.

The above-mentioned objects and advantages of the present invention will be more clearly understood when considered in conjunction with the accompanying drawings, in which:

FIG. *2a* is a simplified diagrammatic view of a first aperture of an interleaved antenna structure.

FIG. *2b* is a simplified diagrammatic view of a second aperture of an interleaved antenna structure.

Figure 3:
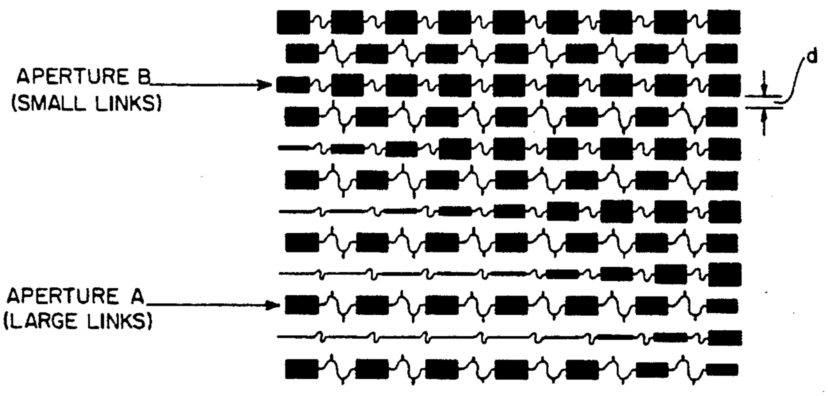

FIG. 3 illustrates a portion of an interleaved antenna structure.

Figure 4:
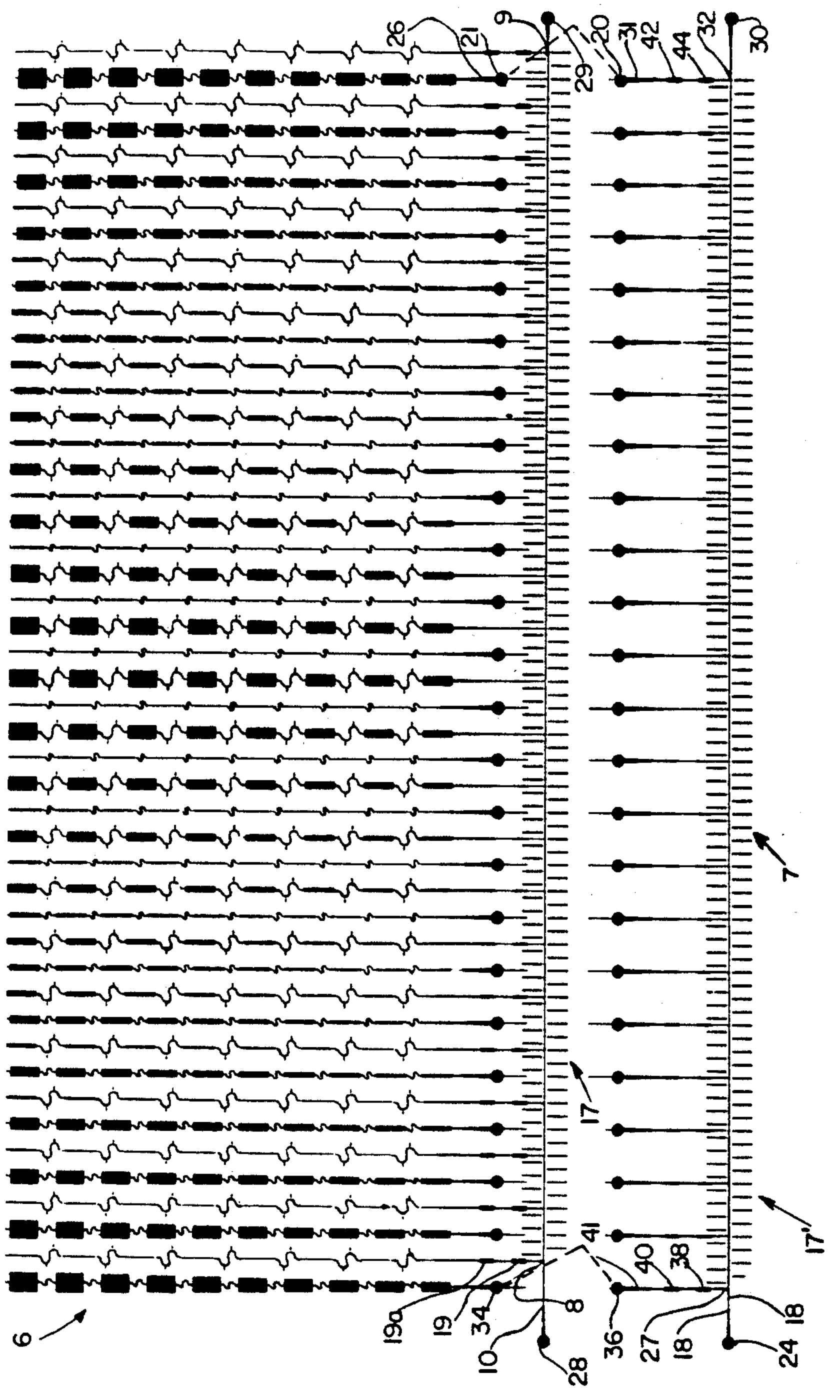

FIG. 4 is an illustration of a "feed thru" connective portion of an interleaved antenna structure.

Figure 5:
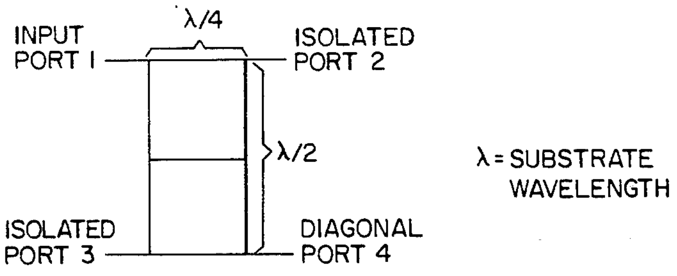

FIG. 5 is a diagrammatic representation of a crossover structure as employed in the present invention.

Figure 6:
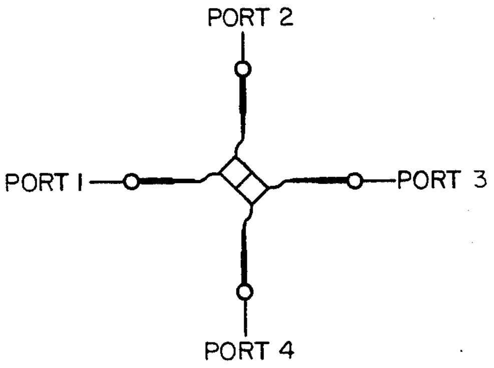
Figure 7A:
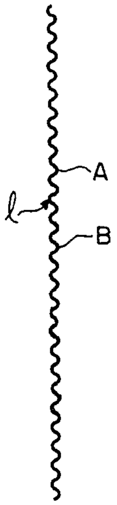
Figure 7B:
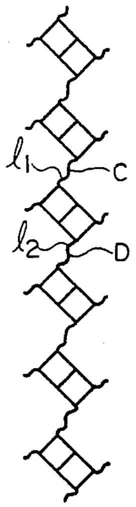

FIG. 6 is a schematic illustration of a crossover test piece.

FIG. *7a* is a diagrammatic view of a serpentine feed line.

FIG. *7b* is a diagrammatic view of a crossover feed line.

Figure 8:
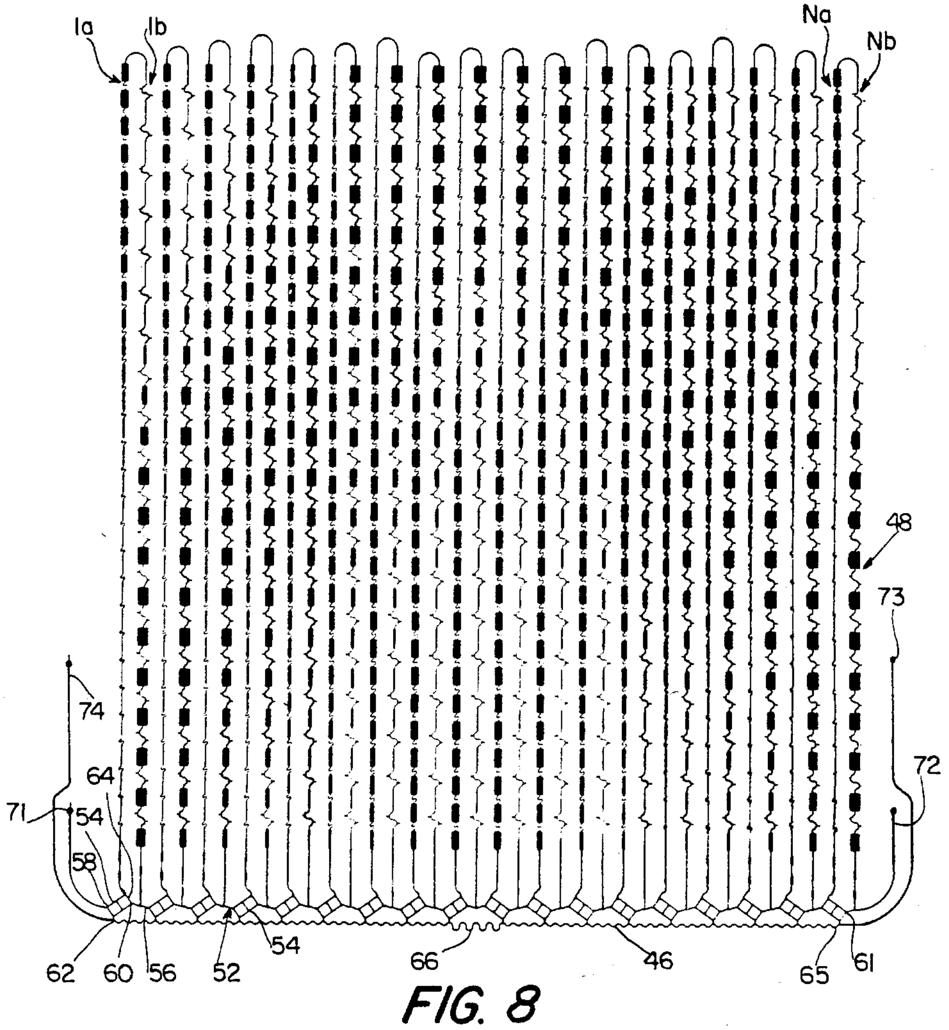

FIG. 8 illustrates the radiating plane of the present interleaved invention with crossover feeds.

DETAILED DESCRIPTION OF THE INVENTION

Figure 1:
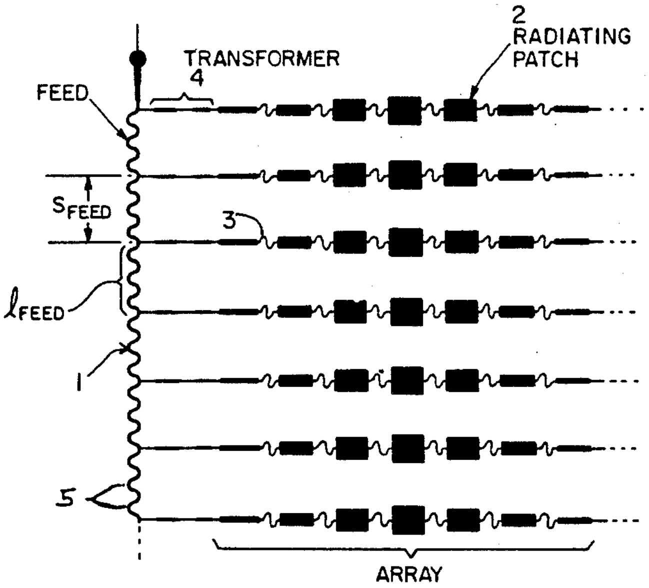
FIG. 1 PRIOR ART
FIG. 1 illustrates a section of a prior art antenna structure.
Figure 2A:
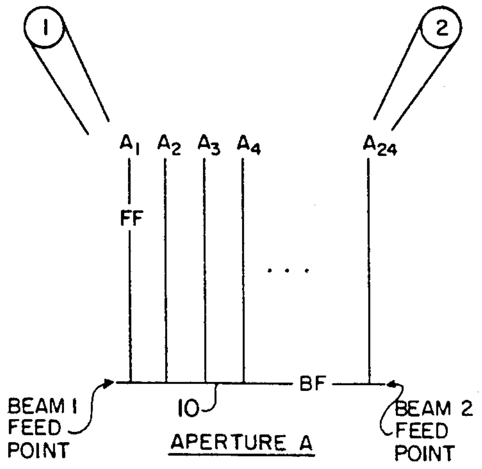
Figure 2B:
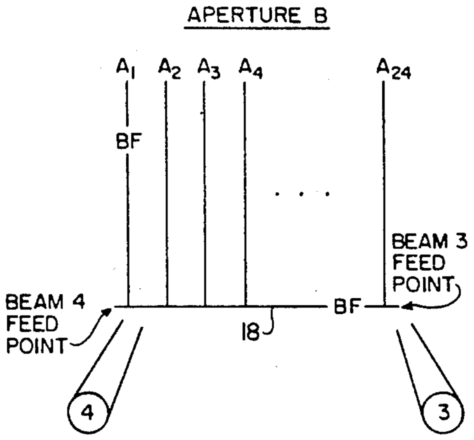

In a conventional microstrip antenna shown in FIG. 1, a single feed, indicated at reference numeral 1, is attached to a plurality of arrays of patch radiators such as shown at 2. The patches are half-wave resonators which radiate power from the patch edges. In order to control beam width, beam shape and side lobe level, the amount of power radiated by each patch must be set. The power radiated is proportional to the patch conductance, which is related to wavelength, line impedance and patch width. These patches are connected by phase links such as indicated at 3, which determine the beam angle relative to the axis of the arrays.

The arrays formed by patches and phase links are connected to the feed line through a two-stage transformer 4 which adjusts the amount of power tapped off the feed 1 into the array. The feed is made up of a series of phase links 5 of equal length, which control the beam angle in the plane perpendicular to the arrays. The feed is also a traveling wave structure. The power available at any given point is equal to the total input power minus the power tapped off by all previous arrays. These structures are broadband limited only by the transmission medium and the radiator bandwidth. In this case, the high Q of the patch radiators limits the bandwidth to a few percent of the operation frequency.

Our copending invention, Ser. No. 650,491 filed Sept. 14, 1984, conceptually operates as two independent antennas of the type discussed in connection with FIG. 1. However, implementation is achieved by interleaving two antennas so as to form superposed apertures in the same plane thereby minimizing the space necessary for the antennas.

The two apertures are diagrammed, in a simplified manner, in FIGS. *2a* and *2b*, respectively. Aperture A may, for example, consist of 24 forward fire arrays connected to a single backfire feed 10. Aperture B, shown in FIG. *2b*, is similarly constructed with a single backfire feed 18. However, aperture B is provided with backfire arrays instead of the forward fire arrays of aperture A. A traveling wave entering a forward/backfire structure produces a beam in a forward/backward direction. The four beams and their associated feed points are shown. When driving the interleaved antenna structure, the various feed points are sequentially driven.

A partial view of our copending interleaved antenna structure is shown in FIG. 3. The arrays wherein the radiating elements are interconnected by large links correspond to aperture A and these will be seen to occupy positions as even numbered arrays. Conversely, those radiating elements interconnected by small links correspond to aperture B and are seen to occupy the odd position arrays. Accordingly, the arrays of apertures A and B alternate in an interleaved, regularly alternating order. It is desirable to make the distance "d" between adjacent arrays as large as possible to assure good isolation between the two separate apertures. However, this would limit the patch width, making control of beam shaping difficult. Accordingly, the patch width values selected are a compromise to permit satisfactory performance for gamma image, side lobes and overwater error.

Referring to FIG. 4 reference numeral 6 generally indicates the printed circuit artwork for etching interleaved antennas of our copending invention. As discussed in connection with FIG. 3, the alternating arrays of apertures A and B exist in coplanar relation. Backfire feed line 10 is connected to each of the even positioned arrays corresponding to aperture A. Thus, for example, junction point 8 exists between backfire feed line 10 and the second illustrated array via two-stage transformers 19 and 19*a*. Feed point 28 corresponds with the first beam as previously mentioned in connection with FIG. *2a* while feed point 29 corresponds with the second beam of that figure. The rightmost array also corresponds with aperture A of FIG. *2a* and this array is seen to be connected to backfire feed line 10 at junction point 9. The feed point 29 at the right end of backfire feed line 10 corresponds with the feed point for the second beam as described in connection with FIG. *2a*. In order to access the interleaved arrays of aperture B without interferring with aperture A, it is necessary to mount the feed for aperture B in insulated, spaced relation from the arrays of aperture A. To accomplish this end a feed thru printed circuit strip 7 has been developed in the form of etched conductors as illustrated in FIG. 4. The etched conductive portions of the main antenna structure and those of the feed thru printed circuit strip 7 are prepared on a single substrate and appropriately separated. By positioning the feed thru strip 7 in insulated overlying relation with the interleaved antennas 6, power may be made to pass through backfire feed 18 to individual backward-firing arrays of the interleaved antenna. Thus, for example, by driving feed point 24, corresponding to the fourth beam feed point of FIG. *2b*, power is tapped off at junction point 27 through two-stage transformers 38 and 40 to the interconnected conductive section 41 terminating in feed thru pad 36. With feed thru printed circuit strip 7 in appropriate overlying relation with the feed end of the interleaved antenna 6, feed thru pad 36 is positioned in registry with feed thru pad 34 of the first backward-firing array thereby completing a connection between the feed point 24 and the array. This feed thru connection between pads 36 and 34 is indicated by a dotted line. In a similar manner, feed point 30, corresponding to the third beam feed point of FIG. 6, provides power to the rightmost illustrated backward firing array from tap off point 32 to feed thru pad 20, via interconnected conductive section 31 and two-stage transformers 42 and 44. A feed thru connection between pads 20 and 21 is indicated by the illustrated dotted line. A detailed view of the feed thru construction and explanation appears in our copending application.

The feed thru holes introduce electrical loss, while complicating the mechanical design and fabrication of the antenna. To alleviate these problems, the present invention accesses the small link antenna arrays without the use of the backfeed of FIG. 4. This is achieved by using a known microwave structure in a novel manner which allows the antenna feed lines to cross over one another without interferring electrically.

The known structure which allows microstrip transmission lines to cross within a narrow frequency band has been described in Wight, *A Microstrip and Stripline Crossover Structure*, IEEE Transactions on Microwave Theory and Techniques, May 1976, at 270. As described in this article, the development of microstrip and stripline theory has resulted in transmission-line circuits of increased complexity. As circuit packaging densities increase, transmission-line layout and routing problems become important. Situations may arise where signal channels must geometrically cross each other. A four-port network which allows two signal paths to cross over while maintaining high isolation and which is constructed with the use of hybrid technology is described in the reference article.

It is well known that the signals at the two output ports of a branch-arm hybrid are in phase quadrature and have magnitudes equal to $1/\sqrt{2}$ of the incident signal. If two branch-arm hybrids are cascaded, it can be shown by applying standard hybrid analysis techniques that the signal emerges only at the diagonal port of the composite structure, theoretically, with no insertion loss. Very little power emerges from the remaining two ports and consequently, high isolation between two crossing signal channels can be achieved. The usable bandwidth for 0-dB crossover is determined by the product of the swept frequency characteristics for the two hybrids and can be increased using multisection structures. Two cascaded single-section hybrids are reducible to the four-port structure shown in FIG. 5. FIG. 5 shows this "crossover" structure schematically. Loss from the input port to the diagonal port of less than 1.0 dB and isolation of greater than 20 dB at center frequency has been reported. FIG. 6 shows a test piece which was etched on 3M 217 substrate and covered by a 0.125" thick radome of the same material. Diagonal port loss of 0.18 dB, VSWR of 1.1 and isolation of greater than 25 dB was measured at center frequency.

FIG. *7a* shows a serpentine feed line and FIG. *7b* shows the equivalent feed employing crossovers. Phase shift from point A to point B, which controls the radiated beam angle, is proportional to the line path length l. Similarly, the phase shift from point C to point D is proportional to the path length $l_1+l_2$, plus the phase shift through the crossover, which has been calculated to be 270°. Beam angles can be varied by changing the length of $l_1$ and $l_2$, while the crossover dimensions remain constant. The measured insertion loss of the crossover feed (22 elements) was 4.6 dB, versus 5.7 dB for the equivalent serpentine feed line. A VSWR of 1.06 was measured at 13.380 GHz.

FIG. 8 shows the crossover feed as it is employed in an interleaved microstrip antenna in accordance with the present invention. Basically, a standard serpentine line 46 is used as the outer feed, accessing arrays 1*a*–N*a* through the crossover feed and the crossover feed directly accesses arrays 1*b*–N*b*. The inner crossover feed 52 includes interconnected individual crossover structures 54 constituting a feed line generally parallel to the serpentine feed line 46. The arrays 48 and both feeds 46 and 52 are advantageously disposed in the same plane.

Concentrating upon the leftmost crossover feed structure, the first input port 58 is connected to the illustrated port terminal 71. Port 60 is diagonal to port 58 and connects the leftmost crossover structure 54 with an adjacently interconnected crossover structure by connecting segment 56. This pattern of interconnected crossover structures is repeated along the length of the crossover feed until the second port terminal 72 is connected to port 61 of the rightmost positioned crossover structure. Interconnecting segment 56 of the leftmost crossover structure accesses array 1*b* and this accessing pattern to the arrays is repeated for all the evenly positioned arrays up to and including $N_b$.

Port terminal 74 is directly connected to the left end 62 of serpentine feed line 46. This end of the serpentine feed is directly connected to a port of the leftmost positioned crossover structure as indicated in the figure. Diagonally opposite port 64 of this crossover structure accesses array 1*a*. Similar connections exist for the remaining crossover feed structures and all odd positioned arrays up to and including array $N_a$ which communicates with the right end 65 of serpentine feed line 46. Port terminal 73 is directly connected to the right feed line end 65 thereby completing the connections between the four port terminals 71–74 and the arrays 48. The serpentine curves 66 at the center of the serpentine feed line 46 are enlarged so as to achieve desired phase correction.

Table 1 gives the port-to-port isolation at an operating frequency of 13.325 GHz.

TABLE 1

Port-to-Port isolation $f_o$ = 13.325 GHz

| Ports | Isolation |
|---|---|
| 1–2 | 27 dB |
| 1–3 | 28 |
| 1–4 | 35 |
| 2–3 | 35 |
| 2–4 | 32 |
| 3–4 | 30 |

The isolation bandwidth of the crossover feed was determined by measuring the level of radiation produced by leakage into the isolated arrays. Bandwidths of 200 to 400 MHz were measured. Produced patterns agreed closely with those produced by standard feed configurations.

As will now be appreciated, the present feed system is applicable to any interleaved antenna which requires both apertures to be fed from one end. High receiver/transmitter isolation and temperature compensation, both benefits of interleaved antennas, may thus be gained, in addition to reduced electrical loss compared to feed thru connections.

It should be understood that the invention is not limited to the exact details of construction shown and described herein for obvious modifications will occur to persons skilled in the art.

We claim:

1. In a microstrip or stripline antenna, a feed system for accessing at least first and second radiating array groups, the system comprising:

a first traveling feed;

a plurality of crossover structures, each structure having first and second ports for transmitting a first signal therebetween, and third and fourth ports for transmitting a second signal therebetween;

means serially interconnecting the first and second ports of a plurality of structures thereby forming a second traveling feed;

means connecting the first and second ports of the interconnected structures to correspondingly positioned arrays of the first group;

means connecting the third ports of the interconnected structures to correspondingly positioned spaced points along the first traveling feed;

means connecting the fourth ports of the interconnectd structures to correspondingly positioned arrays of the second group;

whereby the first and second traveling feeds couple their respective signals to the array groups without significant interaction therebetween.

2. The feed system set forth in claim 1 wherein the first and second groups of arrays are located in the same plane as the first and second traveling feeds thereby eliminating the necessity of a backfeed and ancillary feed thru elements.

3. The feed system set forth in claim 1 wherein the first and second array groups are interleaved.

4. The feed system set forth in claim 1 wherein the first and second feeds are located adjacent one end of the interleaved arrays.

5. The feed system set forth in claim 1 wherein the first traveling feed is serpentine.

6. The feed system set forth in claim 2 wherein the first and second array groups are interleaved.

7. The feed system set forth in claim 6 wherein the first and second feeds are located adjacent one end of the interleaved arrays.

8. The feed system set forth in claim 7 wherein the first traveling feed is serpentine.

9. A microstrip or stripline antenna comprising:

at least first and second interleaved radiating array groups located in the same plane;

a first traveling feed located in the same plane as the array groups and positioned transversely to the first ends of the array groups;

a plurality of crossover structures, each having first and second ports for transmitting a first signal therebetween, and third and fourth ports for transmitting a second signal therebetween;

means serially interconnecting the first and second ports of a plurality of structures thereby forming a second traveling feed located in the same plane as the first traveling feed and the array groups;

means connecting the first and second ports of the interconnected structures to correspondingly positioned arrays of the first group;

means connecting the third ports of the interconnected structures to correspondingly positioned spaced points along the first traveling feed;

means connecting the fourth ports of the interconnected structures to correspondingly positioned arrays of the second group;

whereby the first and second signals are coupled through the crossover structures to the array groups with high signal isolation therebetween.

10. The antenna set forth in claim 9, wherein the first traveling feed is serpentine.

* * * * *